(12) United States Patent
Hama et al.

(10) Patent No.: US 6,573,699 B1
(45) Date of Patent: Jun. 3, 2003

(54) DEVICE FOR MEASURING ELECTRIC CURRENT BY USE OF ELECTRO-OPTICAL CRYSTAL

(75) Inventors: Soichi Hama, Kawasaki (JP); Akira Fujii, Kawasaki (JP); Hidenori Sekiguchi, Kawasaki (JP); Shinichi Wakana, Kawasaki (JP); Toshiaki Nagai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/660,321

(22) Filed: Sep. 12, 2000

(30) Foreign Application Priority Data

Oct. 5, 1999 (JP) .............................. 11-284492

(51) Int. Cl.$^7$ .............................................. G01R 31/00
(52) U.S. Cl. ........................ 324/96; 324/73.1; 324/751
(58) Field of Search ................. 324/500, 523, 324/750, 751, 753, 96, 73.1, 244.1, 305, 727, 76.49; 356/237; 350/396, 96.11, 390; 359/245, 257, 315

(56) References Cited

U.S. PATENT DOCUMENTS 4,910,458 A * 3/1990 Forsyth ...................... 324/753
5,272,434 A * 12/1993 Meyrueix ................... 324/751
5,844,249 A * 12/1998 Takano ..................... 356/237.1

FOREIGN PATENT DOCUMENTS

JP 6027154 2/1994

OTHER PUBLICATIONS

Valdmanis et al.; "Subpicosecond Electroopic Sampling: Principles and Applications"; *IEEE Journal of Quantum Electronics*; vol. QE–22, No. 1, pp.69–78; Jan. 1986.

* cited by examiner

*Primary Examiner*—Kamand Cuneo
*Assistant Examiner*—Trung Nguyen
(74) *Attorney, Agent, or Firm*—Greer, Burns & Crain, Ltd.

(57) ABSTRACT

A device for measuring an electric current of a target circuit includes a pair of contact pins, a resistor electrically connected between the contact pins, a voltage drop appearing across the resistor when the contact pins come into contact with the target circuit to direct the electric current to the resistor, and an electro-optical crystal electrically connected between the contact pins in parallel with the resistor, the electro-optical crystal having a voltage applied thereto responsive to the voltage drop appearing across the resistor, wherein the voltage applied to the electro-optical crystal changes polarization of a light beam passing therethrough, thereby allowing the electric current to be measured from the polarization.

7 Claims, 14 Drawing Sheets

PRIOR ART

PRIOR ART

DEVICE FOR MEASURING ELECTRIC CURRENT BY USE OF ELECTRO-OPTICAL CRYSTAL

BACKGROUND OF THE INVENTION

1. Field of the Invention

The present invention generally relates to devices for measuring electric current waveforms and differential probes, and particularly relates to a device for measuring electric current waveforms and a differential probe wherein the differential probe is designed to measure waveforms of high-speed electric currents flowing through wires by using electro-optical effect.

2. Description of the Related Art

In designing and manufacturing of electrical circuits on printed circuit boards, it is vitally important to measure waveforms of electric currents flowing through wires of the circuits. To this end, various schemes are available for measuring electric currents. A typical method is one that detects an induced magnetic field generated by an electric current.

FIG. 18 is a schematic drawing for explaining a method of current detection by use of an electric probe utilizing a Hall device, which is a typical example of a device that detects an induced magnetic field.

An induced magnetic field that is generated by an electric current flowing through a wire 61 is intensified by a magnetic material ring 62. The magnetic material ring 62 has a Hall device 63 integrated therein, which works with a detection amplifier 64 to detect the induced magnetic field based on the principle of the Hall effect.

In this case, however, presence of a gap in the magnetic material ring 62 results in a significant decrease in detection sensitivity, so that the magnetic material ring 62 needs to fully circle around the wire 61. Because of this, the wire 61 that is formed as part of a Cu pattern on a printed circuit board has to be cut, and a lead line has be to be led from the wire 61.

Since the lead line has its own inductance, the lead line undesirably affects circuit operation if the operation speed is high. This makes it impossible to measure waveforms of high-speed electric currents.

Another method for measuring electric currents is to measure a current from a voltage drop by utilizing the fact that a current flowing through a resistor can be measured from a voltage drop and the resistance. Wires in circuits, however, do not have sufficient resistances to allow a detectable voltage drop to develop. In this case, a resistor needs to be inserted, and a voltage drop between the two end points of the resistor is detected.

When such a voltage drop is measured between the two end points of a resistor device, potentials may be detected at both ends, and a difference between the detected potentials may be obtained thereafter. Such measurement does not provide a true voltage drop waveform in a strict sense since the two measurements are not obtained simultaneously.

For the purpose of measuring an electric current waveform, therefore, a differential probe is often used. In particular, a FET differential probe, which has high input impedance, is useful in measuring high-speed signals.

Electrical differential probes such as FET differential probes, however, are susceptible to error that is caused by asymmetry of circuit structures. Such error may be miniscule, but cannot be ignored since a differential signal to be detected has small amplitudes in comparison with amplitudes of common-mode signals.

Further, since an electrical measurement system is connected to a target system to be measured, the input impedance of a probe decreases in a high-frequency range, affecting the target system to a noticeable degree.

To obviate the problem of input impedance, electro-optical crystal having the Pockels effect may be utilized.

Such electro-optical crystal includes crystal of a vertical type and crystal of a horizontal type. The crystal of a vertical type has a high sensitivity to electric fields that are parallel to the optical axis of passing light, and the crystal of a horizontal type has a high sensitivity to electric fields that are perpendicular to the optical axis. As an example of use of the electro-optical effect of vertical-type electro-optical crystal, a voltage level is measured based on the amount of polarization by detecting the polarization of a laser beam when the laser beam passes through or is reflected by electro-optical crystal in a configuration in which the laser beam is directed to the electro-optical crystal situated in proximity of a measurement point. (See J. A. Valdmanis and G. Mourou, IEEE Journal of Ququntum Electronics, Vol. QE-22, 1986, pp. 69–78.)

FIG. 19 is a schematic diagram for explaining a method of measuring a voltage level by use of a vertical-type electro-optical crystal 71 such as ZnTe, $Bi_{12}SiO_{20}$, or the like.

The vertical-type electro-optical crystal 71 has a surface thereof provided with a reflection electrode 72, on which a probe needle 73 is situated. The other surface of the vertical-type electro-optical crystal 71 has a transparent electrode 74 provided thereon for receiving a reference voltage.

The probe needle 73 comes in contact with a wire 75 formed on a circuit board 76, so that a target signal 77 is applied to the vertical-type electro-optical crystal 71 via the probe needle 73. Changes in the applied target signal 77 are detected as the amount of polarization of a laser beam 78.

This method of measuring a voltage level by use of the vertical-type electro-optical crystal 71, however, is directed to measurement of a voltage level applied to a wire. Namely, this method cannot be directly applied to measurement of high-speed electric currents that pass through wires in a circuit that is formed on a printed circuit board.

Further, in respect of the vertical-type electro-optical crystal 71, a travel direction of the laser beam 78 is the same as a direction of a detectable electric field. If the thickness of the vertical-type electro-optical crystal 71 is decreased in order to intensify the electric field, interaction between the laser beam 78 and the vertical-type electro-optical crystal 71 will become weaker. It is thus difficult to step up detection efficiency.

FIG. 20 is a schematic diagram for explaining a method of measuring a voltage level by use of a horizontal-type electro-optical crystal 81 such as $LiNbO_3$, $LiTaO_3$, or the like. (See Japanese Patent Laid-open Application No. 6-27154.)

In FIG. 20, a target voltage E to be measured is applied between nodes a and b of a bridge circuit, and the horizontal-type electro-optical crystal 81 is connected between nodes c and d of the bridge circuit. Light beams from opposite-phase light sources D1 and D2 are directed to photosensitive resistors R1 and R2 via optical fibers 82 and 83, respectively. A light beam from a light source D3 of a measurement unit 86 is directed to and passes through the horizontal-type electro-optical crystal 81, and the output beam having polarization thereof changed according to the Pockels effect is detected by a photoelectric device PD.

This method of measuring a voltage level is quite peculiar, and merely offers a schematic configuration. In practice, this method cannot be applied to measurement of high-speed electric currents despite the high-impedance feature of the method.

As described above, there is no method to date that measures, with sufficient accuracy by use of a simple configuration, high-speed electric currents as they flow through wires.

Accordingly, there is a need for a scheme that can measure high-speed electric currents with sufficient accuracy by use of a simple configuration.

SUMMARY OF THE INVENTION

It is a general object of the present invention to provide a device that substantially obviates one or more of the problems caused by the limitations and disadvantages of the related art.

It is another and more specific object of the present invention to provide a device that can measure high-speed electric currents with sufficient accuracy by use of a simple configuration.

In order to achieve the above objects according to the present invention, a device for measuring an electric current of a target circuit includes a pair of contact pins, a resistor electrically connected between the contact pins, a voltage drop appearing across the resistor when the contact pins come into contact with the target circuit to direct the electric current to the resistor, and an electro-optical crystal electrically connected between the contact pins in parallel with the resistor, the electro-optical crystal having a voltage applied thereto responsive to the voltage drop appearing across the resistor, wherein the voltage applied to the electro-optical crystal changes polarization of a light beam passing therethrough, thereby allowing the electric current to be measured from the polarization.

In the device as described above, the resistor having a small resistance that would not affect circuit operation is inserted into the target circuit, and the voltage drop is detected by measuring polarization statuses of the light beam. This method can, by its nature, avoid error that would be caused by asymmetry between two nodes if an electric probe such as an FET probe or the like was employed.

Further, since the electro-optical crystal is electrically independent of the detection system, input impedance for the detection system is practically infinite, thereby not affecting the detection system at all.

When a horizontal-type electro-optical crystal is used as the electro-optical crystal, an incident direction of the light beam is perpendicular to the direction of a detectable electric field, so that the thickness of the electro-optical crystal can be freely altered to adjust the degree of interaction under the condition of a constant electric field.

Further, the electro-optical crystal and the resistor are arranged in parallel between the contact pins, which serve as contact nodes that come into contact with the target circuit. The probe having such a configuration makes it easier to measure electric-current waveforms with respect to various types of circuit wires.

Since the electro-optical crystal typically has natural birefringence characteristics, an optical device may be provided for the purpose of compensating for the birefringence characteristics along the travel direction of a laser beam.

The horizontal-type electro-optical crystal made of LT ($LiTaO_3$), LN ($LiNbO_3$), or the like has birefringence characteristics, which make returning light have a different phase from that of incident light even in the absence of applied voltage. Because of this reason, it is desirable to provide a compensation-purpose optical device for compensating for natural birefringence. In general, a horizontal-type electro-optical crystal the same size as the electro-optical crystal is provided at a 90° angle around the optical axis, thereby canceling the birefringence.

Moreover, it is preferable to provide a heater for the compensation-purpose optical device.

In general, a temperature factor of the electro-optical crystal is significant, so that a phase difference indicative of polarization statuses varies depending not only on the applied voltage but also on temperature. Therefore, an effect of temperature variation on the electro-optical crystal needs to be cancelled when the resistor for generating the applied voltage generates heat. To this end, a heater is provided.for the compensation-purpose optical device so as to resolve the temperature dependency.

Further, a heat-control unit is preferably provided for the purpose of controlling the heater such that signals detected under the conditions of a particular phase have the same magnitude.

Since an average of the target electric signal is unknown, the control of the heater is preferably conducted such that the signals detected under the condition of the same reference phase have the same magnitude.

Other objects and further features of the present invention will be apparent from the following detailed description when read in conjunction with the accompanying drawings.

DESCRIPTION OF THE PREFERRED EMBODIMENTS

In the following, a principle and embodiments of the present invention will be described with reference to the accompanying drawings.

Figure 1:
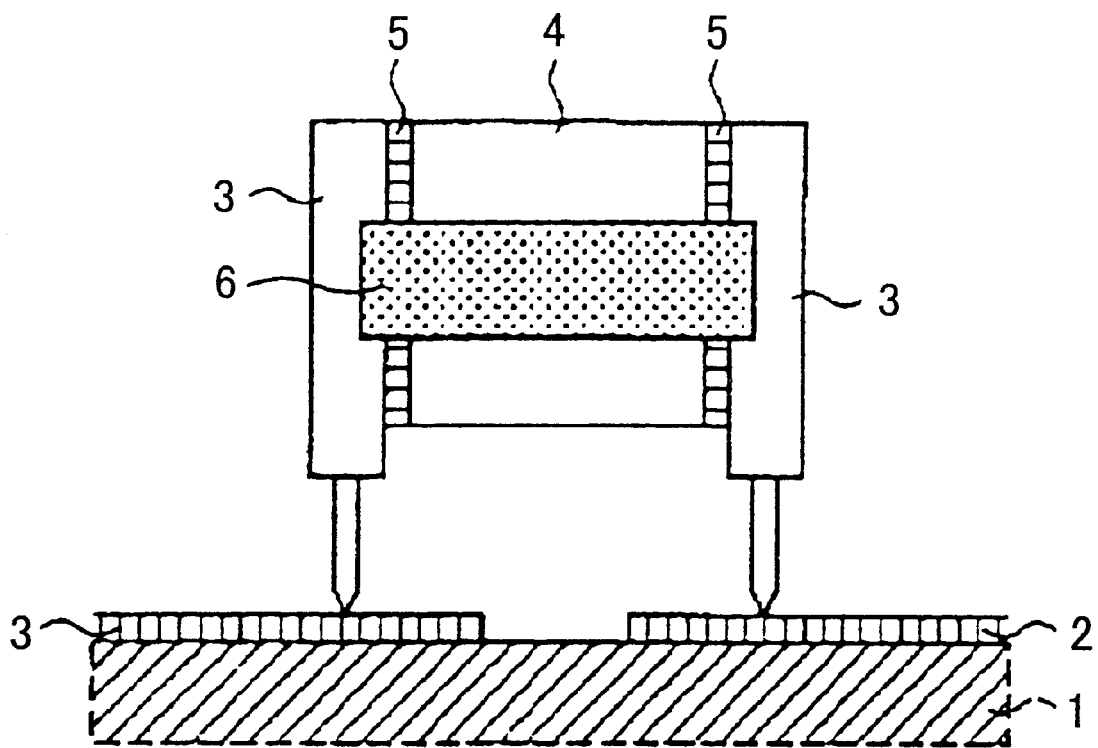
FIG. 1 is an illustrative drawing for explaining a principle of the present invention.

FIG. 1 is an illustrative drawing for explaining a principle of the present invention. With reference to FIG. 1, the principle of the present invention will be described.

FIG. 1 shows a schematic configuration of a probe that constitutes an electric-current-waveform measurement device. A board 1 shown in FIG. 1 is a printed circuit board or the like.

The electric-current-waveform measurement device of FIG. 1 includes a pair of contact pins 3, an electro-optical crystal 4, electrode films 5, and a resistor 6.

The electro-optical crystal 4 and the resistor 6 are provided in parallel between the contact pins 3, with the electrode films 5 attached to the electro-optical crystal 4. The contact pins 3 are brought into contact with a circuit wire 2 that is cut halfway along the extension thereof, so that an electric current of the circuit wire 2 is directed to the resistor 6. A voltage drop through the resistor 6 is applied to the electro-optical crystal 4, to which a laser beam is directed. A returning beam is detected in terms of a polarization status thereof by electro-optical sampling, thereby achieving measurement of electric-current waveform.

In this manner, a resistor having a small resistance that would not affect circuit operation is inserted into the circuit, and a voltage drop is detected by use of an electro-optical sampling. This method can, by its nature, avoid error that would be caused by asymmetry between two nodes if an electric probe such as an FET probe or the like was employed.

Further, since the electro-optical crystal 4 is electrically independent of the detection system, input impedance for the detection system is practically infinite, thereby not affecting the detection system at all.

When a horizontal-type electro-optical crystal is used as the electro-optical crystal 4, an incident direction of the laser beam is perpendicular to the direction of a detectable electric field, so that the thickness of the electro-optical crystal 4 can be freely altered to control interaction under the condition of a constant electric field.

Further, the electro-optical crystal 4 and the resistor 6 are arranged in parallel between the contact pins 3, which serve as contact nodes that come into contact with the circuit wire 2. The probe having such a configuration makes it easier to measure electric-current waveforms of various circuit wires.

In the configuration described above, it is preferable to insert a resistor between one of the contact pins 3 and the electro-optical crystal 4 in order to compensate for a time difference of a voltage drop as the voltage is applied to the electro-optical crystal 4.

When extremely high-speed signals are measured, an error caused by the time difference observed when an electrical pulse passes through the resistor 6 becomes too significant to ignore. For example, when a voltage level at an output end is delayed from a voltage level at an input end, a voltage drop will suffer an error that is commensurate with a slope of the waveform multiplied by the time difference. Since this error increases with an increase in signal speed, a resistor inserted between one of the contact pins 3 and the electro-optical crystal 4 can compensate for the time difference of the voltage that is applied to the electro-optical crystal 4.

Further, the electric-current-waveform measurement device of the present invention includes a resistor bridge circuit that is provided between the contact pins 3 where the bridge circuit is comprised of a two parallel sets of resistor series each including a resistor for generating an applied voltage and a resistor element for compensating for time differences. A junction between resistors in each resistor series is connected to a corresponding end of the electro-optical crystal 4. The contact pins 3 are brought into contact with a circuit wire 2 that is cut halfway along the extension thereof, so that an electric current of the circuit wire 2 is directed to the resistor 6. A voltage drop through the resistor 6 is applied to the electro-optical crystal 4, to which a laser beam is directed. A returning beam is detected in terms of a polarization status thereof by electro-optical sampling, thereby achieving measurement of electric-current waveform.

In this manner, the resistor bridge circuit that is comprised of a two parallel sets of resistor series each including a resistor for generating an applied voltage and a resistor element for compensating for time differences may be used for the purpose of compensating for time differences. This configuration insures a symmetric structure with respect to the pair of contact pins 3, thereby eliminating a need that a direction of the probe must be correct when the probe is used to measure an electric current.

In the following, a first embodiment of the present invention will be described.

Figure 2:
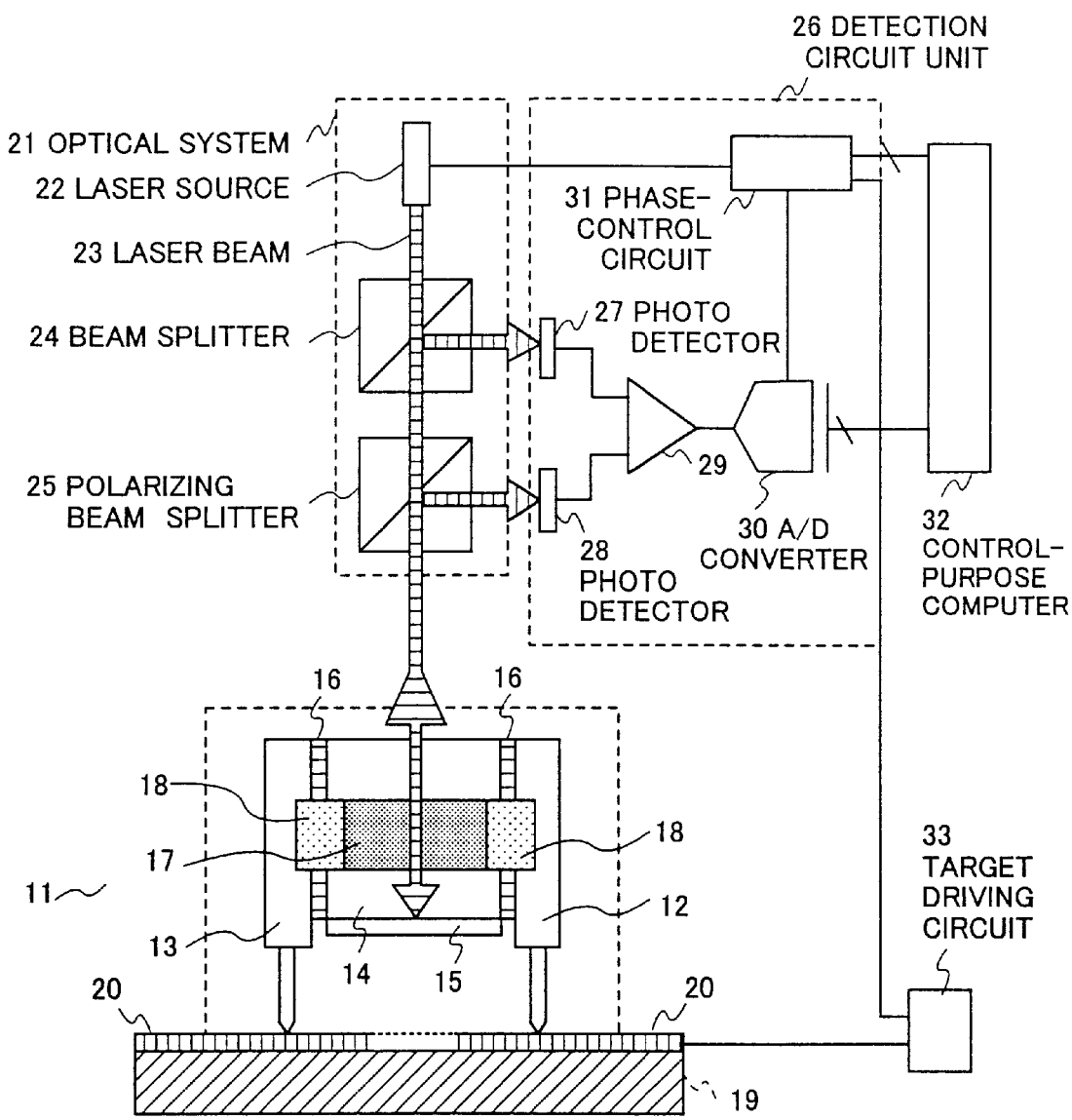
FIG. 2 is a schematic diagram of an electric-current-waveform measurement device based on electro-optical sampling according to a first embodiment of the present invention.

FIG. 2 is a schematic diagram of an electric-current-waveform measurement device based on electro-optical sampling according to the first embodiment of the present invention.

The electric-current-waveform measurement device of FIG. 2 includes a probe 11 having an electro-optical crystal provided therein, an optical system 21 emitting a pulse laser beam and having a deflection system for deflecting a returning light beam according to polarization thereof, and a detection-circuit unit 26 for outputting a signal responsive to polarization of the returning light beam.

The probe 11 includes a pair of contact pins 12 and 13, a horizontal-type electro-optical crystal 14, a reflection mirror 15, electrode films 16, a resistor 17, and connection units 18. The horizontal-type electro-optical crystal 14 is electrically connected to and situated between the contact pins 12 and 13 via the electrode films 16, and has the reflection mirror 15 provided on a lower surface thereof. The reflection mirror 15 is made of $LiTaO_3$. The resistor 17 is connected to the horizontal-type electro-optical crystal 14 in parallel via the connection units 18 provided at both ends of the resistor 17. The contact pins 12 and 13 are brought into contact with a wire 20 that is formed on a board 19, and is cut halfway through the extension thereof for measurement purposes.

For example, the thickness of the horizontal-type electro-optical crystal 14 between the contact pins 12 and 13 is 0.5 mm, and the diameter of the contact pins 12 and 13 is 0.5 mm. Further, the length of the resistor 17 is 1 mm.

The resistor 17 needs to have a resistance that does not affect operation of the target circuit, and may have a resistance of 1 to 2Ω. Preferably, the resistance may be set to 2Ω.

The optical system 21 includes a laser light source 22, a beam splitter 24, and a polarizing beam splitter 25. The laser light source 22 emits a laser beam 23. The beam splitter 24 allows passage of the laser beam 23 while reflecting a polarized component of the returning light. The polarizing beam splitter 25 allows passage of the polarized component of the returning light while reflecting another polarized component of the returning light. The trigger timing of the laser light source 22 is controlled by a phase-control circuit 31.

The detection-circuit unit 26 includes photo detectors 27 and 28, a differential amplifier 29, an A/D converter 30, and the phase-control circuit 31. The differential amplifier 29 outputs a difference between the outputs of the photo detectors 27 and 28. The A/D converter 30 converts the output of the differential amplifier 29 from analog to digital. The phase-control circuit 31 controls operation timings of the A/D converter 30.

In the electric-current-waveform measurement device as described above, the contact pins 12 and 13 constituting the probe 11 are brought into contact with a wire 20 that is cut halfway through the extension thereof. As the contacts are established, an electric current that would flow through the wire 20 is directed to the resistor 17 via the contact pins 12 and 13, and a voltage drop generated between the two end points of the resistor 17 is applied to the horizontal-type electro-optical crystal 14 via the electrode films 16.

The laser beam 23 is directed to the horizontal-type electro-optical crystal 14 from the direction perpendicular to the direction of the applied voltage. The laser beam 23 is reflected by the reflection mirror 15 situated at the bottom of the horizontal-type electro-optical crystal 14, and the returning beam is split by the polarizing beam splitter 25 and the beam splitter 24. The polarized light beams are supplied to the photo detectors 27 and 28. The differential amplifier 29 outputs an amplified difference. Thus, the voltage applied to the horizontal-type electro-optical crystal 14 is detected. The amount of an electric current is obtained by multiplying the detected voltage drop by the resistance value of the resistor 17.

Since the photo detectors 27 and 28 and the differential amplifier 29 do not cover sufficiently high frequency ranges, high-speed current signals may not be measurable in a direct fashion. A sampling method is thus employed in this case.

Figure 3:
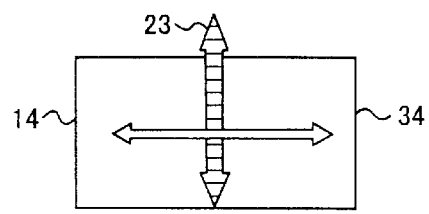
FIG. 3 is an illustrative drawing for explaining spatial relationships between a laser beam and a detectable electric field inside a horizontal-type electro-optical crystal.

FIG. 3 is an illustrative drawing for explaining spatial relationship between the laser beam 23 and a detectable electric field 34 inside the horizontal-type electro-optical crystal 14.

As shown in FIG. 3, the direction of the laser beam 23 is perpendicular to the direction of the detectable electric field 34. Because of this, when the thickness of the horizontal-type electro-optical crystal 14 in the direction of the laser beam 23 is increased, interaction between the laser beam 23 and the electric field 34 is enhanced. Further, the electric field applied to the horizontal-type electro-optical crystal 14 is independent of the thickness of the horizontal-type electro-optical crystal 14. Accordingly, detection sensitivity can be increased at will.

Figure 4:
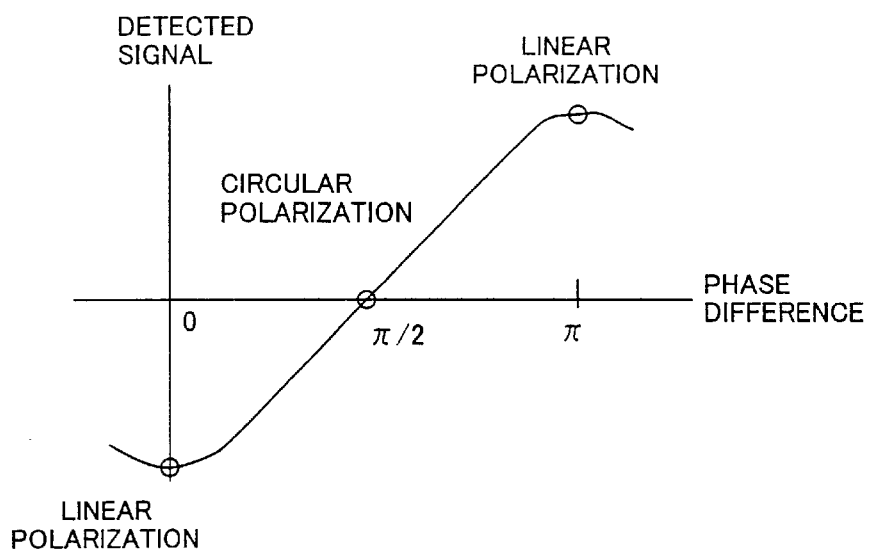
FIG. 4 is a chart showing a change in an output of a differential amplifier.

FIG. 4 is a chart showing a change of the output of the differential amplifier 29.

The output of the differential amplifier 29 varies depending on the polarization statuses of the returning light. When the thickness of the horizontal-type electro-optical crystal 14 is 1 mm, for example, a voltage change by 1 kV may result in a phase change by $\pi$.

Figure 5:
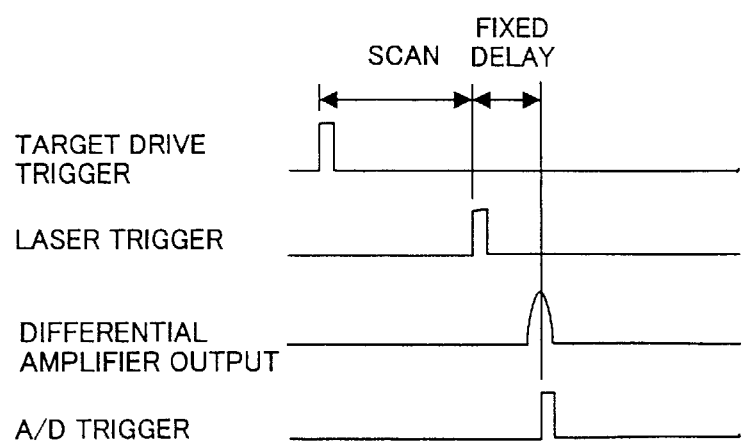
FIG. 5 is a time chart for explaining timings of sampling operation.

FIG. 5 is a time chart for explaining timings of sampling operation.

In order to establish synchronization with a target driving circuit 33 that drives an electric current to be measured, the trigger signal of the target driving circuit 33 is supplied to the phase-control circuit 31. In response, the phase-control circuit 31 generates a laser trigger signal and an A/D trigger signal, which control the operation timings of the laser light source 22 and the A/D converter 30, respectively.

The target electric current is measured at the timings of the laser beam 23 as the laser beam 23 is emitted. Since there is a slight delay in operation from the laser light source 22 to the differential amplifier 29, the timing of the A/D conversion needs to be delayed by a fixed delay time from the timing of the laser trigger.

Use of the electro-optical probe having a module structure as described above makes it possible to measure a high-speed electric current with sufficient accuracy when such measurement was difficult in the related art, and a simple configuration and a single touch of the probe to the wire are all that is necessary in this measurement scheme.

When there is a need to measure an extremely fast electric current signal, it may become impossible to ignore a time period that is required for a current to flow through the resistor 17 connected between the contact pins 12 and 13. Such a time period is referred to as a travel delay. For example, when a voltage level at the output end is delayed from a voltage level at the input end, error is generated that is equal to the time difference multiplied by the slope of a signal waveform. Thus, the faster the signal, the greater the error is. Further, an effect of the error will be increased as the voltage drop between the end points of the crystal is decreased relative to the voltage amplitude applied to these end points because of a small resistance of the probe. To obviate this problem, the travel delay needs to be compensated for.

In the following, a probe according to the second embodiment of the present invention will be described.

Figure 6A:
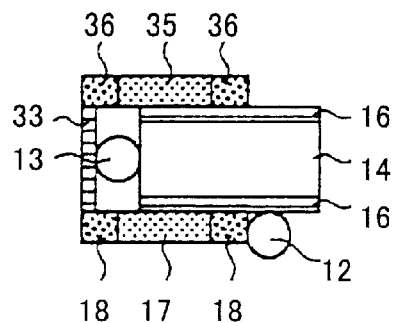
FIG. 6A is a plan view of a probe according to a second embodiment of the present invention.
Figure 6B:
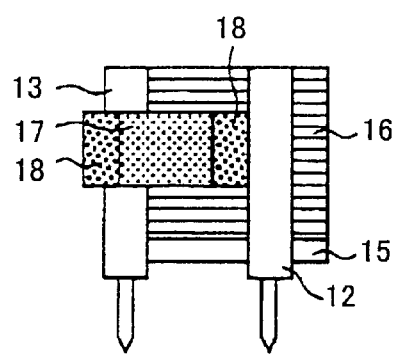
FIG. 6B is a front view of the probe of FIG. 6A.

FIG. 6A is a plan view of the probe according to the second embodiment of the present invention. FIG. 6B is a front view of the probe, and FIG. 6C is a circuit diagram showing an equivalent circuit of the probe.

In the probe according to the second embodiment of the present invention, the contact pin 12 is in contact with an electrode film 16 provided on the horizontal-type electro-optical crystal 14, and the other contact pin 13 is in contact with the horizontal-type electro-optical crystal 14 on a side surface thereof where no electrode film 16 is provided. One of the connection units 18 of the resistor 17 is connected to the contact pin 12, and the other one of the connection units 18 is in contact with an electrode plate 33 electrically connected to the contact pin 13.

A delay element 35 is comprised of a resistor device for the purpose of aligning travel delays. The delay element 35 has one of its connection units 36 in contact with another electrode film 16 provided on the horizontal-type electro-optical crystal 14. The other one of the connection units 36 is in contact with the electrode plate 33 that is electrically connected to the contact pin 13.

Figure 6C:
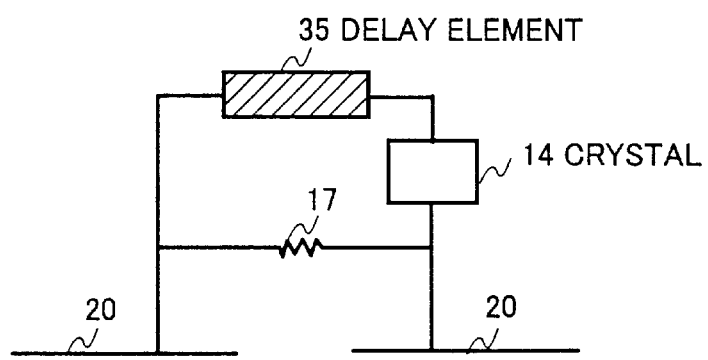
FIG. 6C is a circuit diagram showing an equivalent circuit of the probe of FIG. 6A.

FIG. 6C shows an equivalent circuit. When the resistor 17 is a small resistor such as a chip resistor, a travel delay of approximately 10 ps may develop. If an electric-current waveform having a rising time in the range of hundreds ps needs to be measured, the travel delay as indicated above results in voltages having a substantial timing gap between the end points of the horizontal-type electro-optical crystal 14. In this case, the rise portion of the measured waveform will be distorted.

In this embodiment, the delay element 35 comprised of the same resistor element as the resistor 17 is inserted at the input end in order to compensate for the travel delay. This delay element 35 delays a voltage change at the input end such that the voltage change at the input end is aligned to a voltage change at the output end. This reduces distortion of the rise portion of a measured waveform.

It should be noted that the wire may be simply elongated to serve as the delay element 35. In such a configuration, however, accurate timing adjustment is difficult. Use of the same resistor element as that of the resistor 17 may be the simplest way to achieve the desired result.

The configuration of the probe according to the second embodiment of the present invention is simple. When the probe is used, however, the contact pin 13 must have contact with the wire 20 on the input side thereof, and the contact pin 12 must have contact with the wire 20 on the output side thereof. Namely, the direction of the probe must be correct when it is used.

Figure 7A:
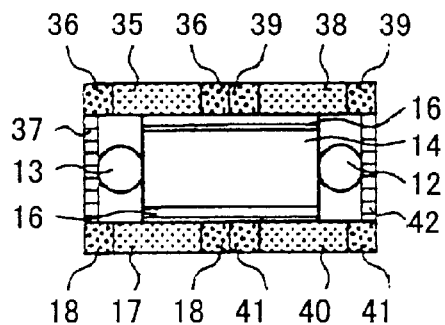
FIG. 7A is a plan view of a probe according to a third embodiment of the present invention.
Figure 7B:
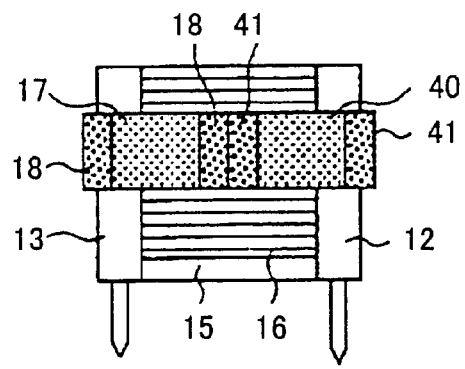
FIG. 7B is a front view of the probe of FIG. 7A.
Figure 7C:
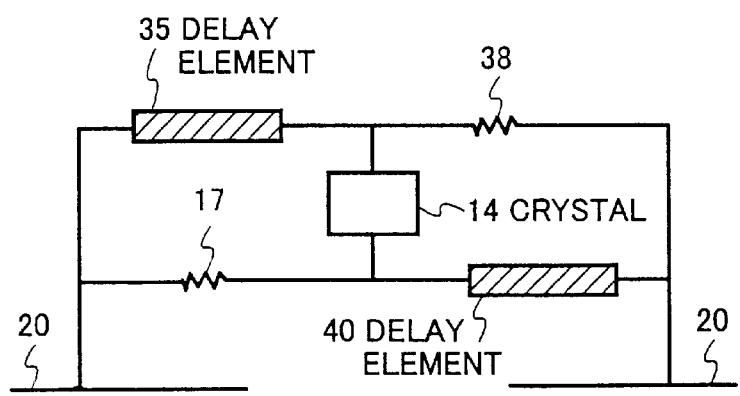
FIG. 7C is a circuit diagram showing an equivalent circuit of the probe of FIG. 7A.

FIG. 7A is a plan view of a probe according to a third embodiment of the present invention. FIG. 7B is a front view of the probe, and FIG. 7C is a circuit diagram showing an equivalent circuit of the probe.

In the probe according to the third embodiment of the present invention, the horizontal-type electro-optical crystal 14 is situated between the contact pins 12 and 13 such as to have contact with the contact pins 12 and 13 through surfaces where no electrode films 16 is provided.

The horizontal-type electro-optical crystal 14 is positioned at the midpoint of a bridge circuit that is comprised of a series of resistors including the resistor 17 and a delay element 40 and another series of resistors including a resistor 38 and the delay element 35. One of the connection units 18 and one of connection units 41 are in contact with one of the electrode films 16, and one of the connection units 36 and one of connection units 39 are in contact with the other one of the electrode films 16. The other one of the connection units 41 is electrically connected to the contact pin 12 through an electrode plate 42, and the other one of the connection units 18 is electrically connected to the contact pin 13 through an electrode plate 37.

The other one of the connection units 39 is electrically connected to the contact pin 12 through the electrode plate 42, and the other one of the connection units 36 is electrically connected to the contact pin 13 through the electrode plate 37.

FIG. 7C shows an equivalent circuit. Almost identical delays develop through the resistor 17 and the delay element 35. Further, the resistor 38 and the delay element 40 introduce almost identical delays. Because of this, no matter which contact pin is brought into contact with a wire on the input side thereof, the travel delay is properly compensated for. This eliminates a need to pay attention to the direction of the probe.

In this embodiment, a resistance R1 of the resistor 17 and a resistance R4 of the resistor 38 may be set equal, and, also, a resistance R3 of the delay element 35 and a resistance R2 of the delay element 40 may be set equal. This ensures that the respective delays generated by the two series of resistors are completely identical. Such configuration can prevent signals from being disturbed when they merge at the merging point.

For example, a voltage V applied to the horizontal-type electro-optical crystal 14 is related to a voltage V0 of the entire bridge circuit as:

$$V/V0 = R2/(R1+R2) - R4/(R3+R4)$$

If R1 and R4 are equal, and R2 and R3 are equal, then, $$V/V0 = (R2-R1)/(R1+R2)$$

Accordingly, if perfect alignment of delays is all that is necessary, the resistor 17 and the delay element 35 should be made identical. Since V becomes zero in such a case, however, these two must be set to slightly different resistances.

If the bridge circuit is configured such that the inserted resistor is the same as when the resistor 17 is alone, the voltage across the horizontal-type electro-optical crystal 14 is always smaller than the voltage between the two end points of the bridge circuit. This results in effective sensitivity being lowered, and, thus, such a configuration should be used with great care.

Figure 8:
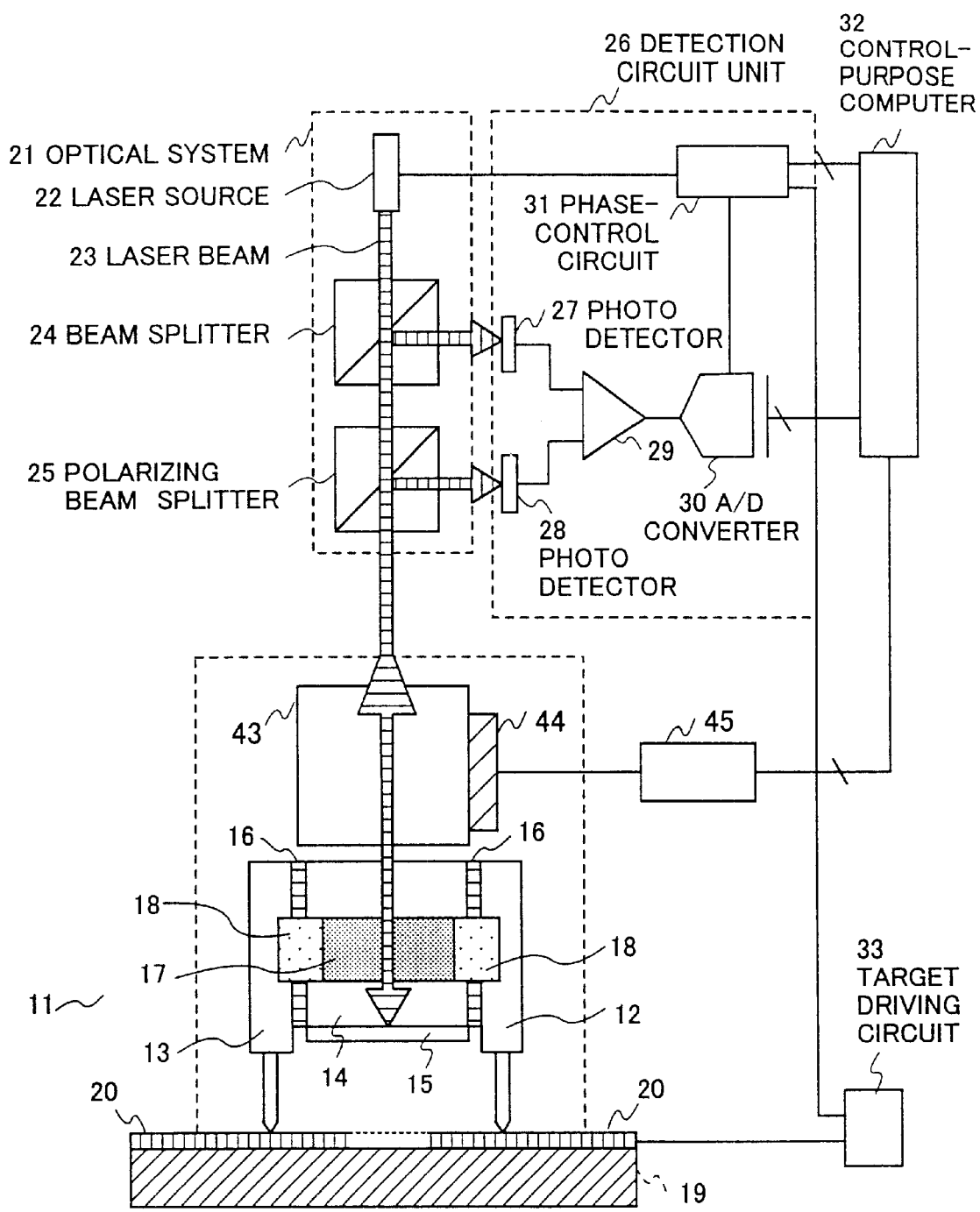
FIG. 8 is a schematic diagram of an electric-current-waveform measurement device according to a fourth embodiment of the present invention.

FIG. 8 is a schematic diagram of an electric-current-waveform measurement device according to a fourth embodiment of the present invention. In the fourth embodiment, birefringence characteristics of the horizontal-type electro-optical crystal 14 are compensated for.

In FIG. 8, the electric-current-waveform measurement device of the fourth embodiment is provided with a compensation-purpose crystal 43 for the purpose of compensating for natural birefringence, and is further provided with a heater 44 for the purpose of suppressing temperature dependency. The heater 44 is controlled by a heater-control unit 45 under the control of a control-purpose computer 32. Except for these differences, a basic configuration and a basic mechanism for measurement are the same as those of the first embodiment, and a description thereof will be omitted.

The horizontal-type electro-optical crystal 14 made of LT (LiTaO₃) or LN (LiNbO₃) has birefringence characteristics, which make returning light have a different phase from that of incident light even in the absence of applied voltage. Because of this reason, it is desirable to provide the compensation-purpose crystal 43 for compensating for the natural birefringence. In general, a horizontal-type electro-optical crystal the same size as the horizontal-type electro-optical crystal 14 is provided at a 90° angle around the optical axis as is done so in the field of an optical communication technology, thereby canceling the birefringence.

In general, a temperature factor of the horizontal-type electro-optical crystal 14 is significant, so that a phase difference indicative of polarization statuses varies depending not only on the applied voltage but also on temperature. A temperature change by 5° C., for example, makes a change in the phase difference by about π. In the electro-optical sampling, a voltage difference in the order of tens to hundreds of millivolts needs to be detected, and this voltage difference corresponds to a vary small phase difference. In comparison, phase changes caused by temperature variation are relatively large, so that an effect of temperature variation on the horizontal-type electro-optical crystal 14 needs to be cancelled when the resistor 17 generates heat due to electrical signals passing therethrough. To this end, the heater 44 is provided for the compensation-purpose crystal 43 so as to resolve the temperature dependency.

Details of resolving the temperature dependency are as follows. The probe 11 is brought into contact with the wire 20. As an electric current flows through the resistor 17, heat is generated that is commensurate with the amount of an average electric current of an electrical signal to be detected, thereby causing a change in the detected signal. In order to compensate for this change, the same amount of heat as that generated by the average electric current should be applied to the compensation-purpose crystal 43. In general, however, the electric current to be detected is unknown, so that the amount of generated heat is also unknown.

In consideration of this, the amount of heat generated by the heater 44 is adjusted such that the detected signal would be the same as when the electrical signal to be detected was absent. Since the electrical signal is the target of measurement, however, a change in the electrical signal also causes a change in the detected signal. It is thus desirable to conduct the adjustment of heat generation under the condition of the same reference phase.

Figure 9:
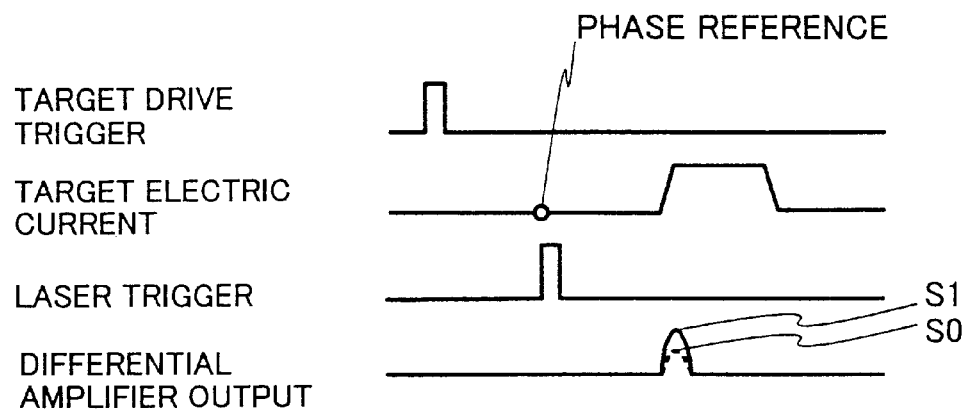
FIG. 9 is a set of timing charts for explaining a method of temperature compensation.

FIG. 9 is a set of timing charts for explaining a method of temperature compensation.

Before the contact pins 12 and 13 of the probe 11 are brought into contact with the wire 20, the phase-control circuit 31 is set to a reference phase. Under this condition, the laser light source 22 emits a laser beam. At a timing predetermined time after the emission of the laser beam, an output of the differential amplifier under the condition of the reference phase is detected and stored as a detected signal S0 that indicates initial conditions prior to contact with the wire.

After this, the contact pins 12 and 13 are brought into contact with the wire 20, and a detected signal S1 under the condition of the same reference phase is measured. The heater-control unit 45 controls the amount of electric current applied to the heater 44 such that the detected signal S1 obtained at the time of electric-current measurement becomes equal to the detected signal S0 indicative of the initial conditions prior to contact with the wire.

In this manner, the heater 44 is provided for the compensation-purpose crystal 43, and the amount of electric current supplied to the heater 44 is adjusted such that the detected signal S1 obtained at the time of current measurement under the condition of the same reference phase becomes equal to the detected signal S0 indicative of the initial conditions prior to contact with the wire. This can suppress temperature dependency.

The method of suppressing temperature dependency described above has a drawback in that a direct current component of an electrical signal is lost, and that an electric current can be measured only relative to an electric current of the reference phase. In the following, a method of compensating for the DC component will be described.

When the heater 44 is a resistor device having identical resistance to that of the resistor 17, an electric current applied to the heater 44 should be equal to the target electric current when averages thereof are considered. This is because the same amount of heat is needed to suppress temperature dependency.

When the heater 44 is a resistor device having resistance different from that of the resistor 17, to insure the same amount of heat, an average of the target electric current is obtained as:

Average of Target Current={(Heater Current)² (Resistance of Heater)/(Resistance of Resistor 17)}½

An average of the waveform measured by electro-optical sampling is obtained over one cycle, and is set equal to the average of the target current obtained above. This can compensate for the lacking DC component.

In practice, the measurement system and the compensation system have different heat-release characteristics. This makes it difficult to achieve highly accurate compensation when the method as described above is employed.

Figure 10:
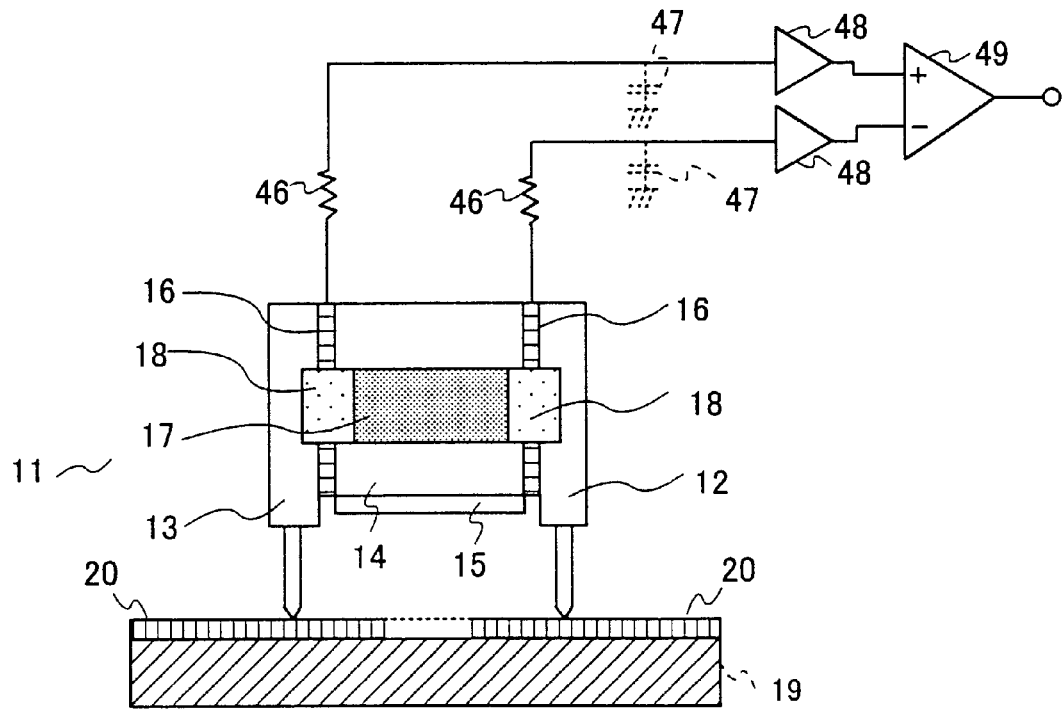
FIG. 10 is an illustrative drawing for explaining a method of accurately measuring a DC component.

FIG. 10 is an illustrative drawing for explaining a method of accurately measuring a DC component.

In FIG. 10, a direct-current-measurement circuit is provided.

A shown in FIG. 10, high-resistance resistors 46 are connected to the respective electrode films 16 at a close distance therefrom, and the voltage levels applied to the electrode films 16 are measured through the high-resistance resistors 46. A voltage difference is then obtained by a differential amplifier 49 via buffer amplifiers 48.

In this case, the high-resistance resistors 46 need to have a resistance value that would not affect operation of the target sample circuit. An appropriate resistance value may depend on samples to be measured, but may be set universally within a range from hundreds GΩ to a few TΩ, without a serious effect on the target samples.

Further, wires between the high-resistance resistors 46 to the buffer amplifiers 48 may be designed to have such a length that the wire, the high-resistance resistors 46, and floating capacitances 47 serve as a low-pass filter. This makes it possible to treat a high-speed target signal not as a waveform but as an accurate reflection of a temporal average.

In the following, a probe according to a fifth embodiment of the present invention will be described.

Figure 11A:
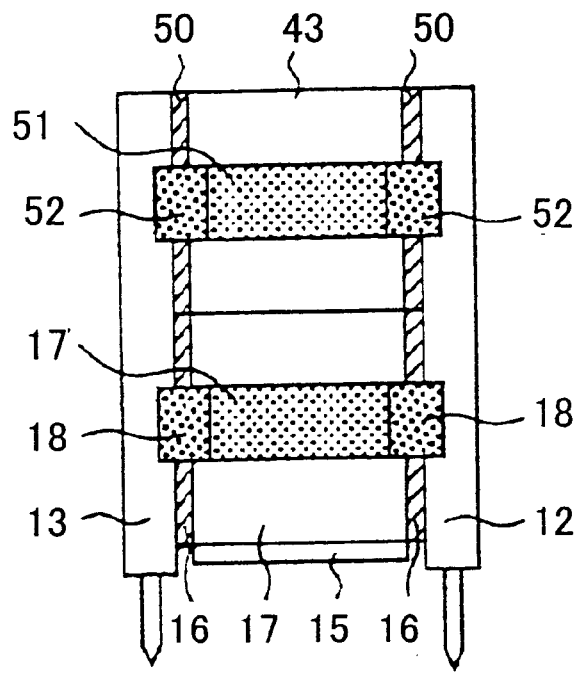
FIG. 11A is a schematic diagram showing a front view of a probe according to a fifth embodiment of the present invention.

FIG. 11A is a schematic diagram showing a front view of the probe according to the fifth embodiment of the present invention.

In the fifth embodiment, the contact pins 12 and 13 are extended so as to support the horizontal-type electro-optical crystal 14 and the compensation-purpose crystal 43 from both sides thereof. Further, an insulating glue 50 is employed to connect the compensation-purpose crystal 43 to the contact pins 12 and 13.

In the same manner as in the first embodiment, the resistor 17 is connected in parallel to the horizontal-type electro-optical crystal 14. Further, a compensation-purpose resistor 51, which has the same characteristics as the resistor 17, is connected in parallel to the compensation-purpose crystal 43.

Figure 11B:
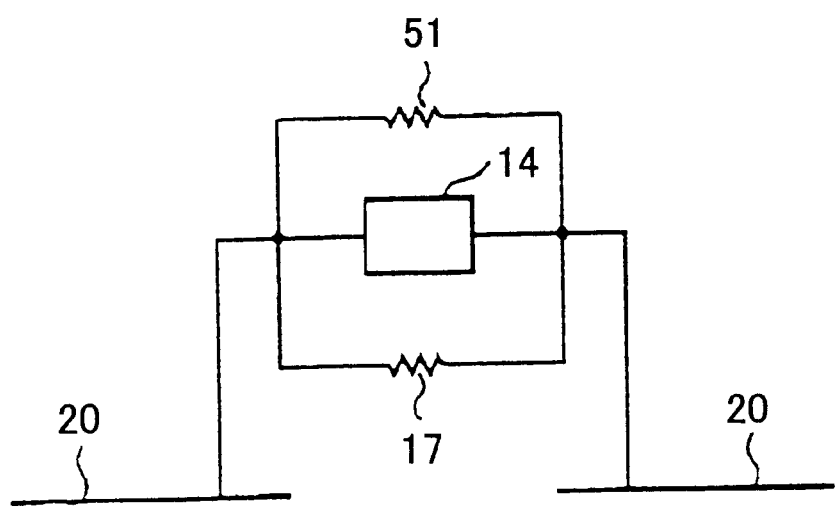
FIG. 11B is a circuit diagram showing an equivalent circuit of the configuration of FIG. 11A.

FIG. 11B is a circuit diagram showing an equivalent circuit of the configuration of FIG. 11A. The same amounts of currents flow through the resistor 17 and the compensation-purpose resistor 51, and the same amount of heat is generated. In this configuration, therefore, temperature dependency can be resolved without providing a heater-control unit for heat-control purposes.

In the following, a probe according to a sixth embodiment of the present invention will be described.

Figure 12A:
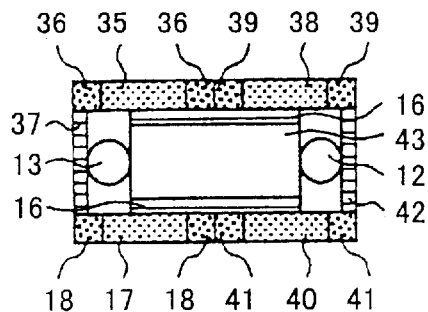
FIG. 12A is a plan view of a probe according to a sixth embodiment of the present invention.
Figure 12B:
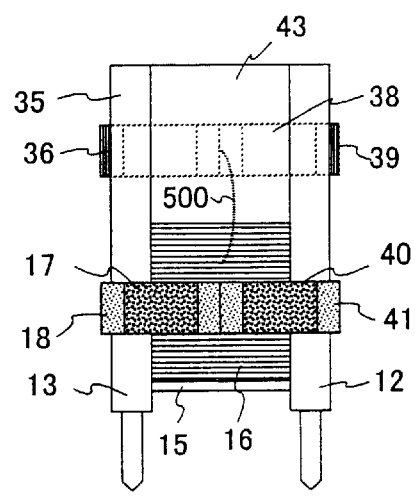
FIG. 12B is a front view of the probe of FIG. 12A.

FIG. 12A is a plan view of a probe according to the sixth embodiment of the present invention. FIG. 12B is a front view of the probe. A basic configuration of the sixth embodiment is the same as that of the third embodiment, except that the contact pins 12 and 13 are elongated to support the horizontal-type electro-optical crystal 14 and the compensation-purpose crystal 43 from both sides thereof.

Figure 12C:
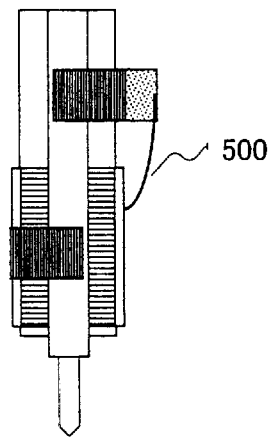
FIG. 12C is a side view of the probe of FIG. 12A.

In the same manner as in the third embodiment, a series of resistors comprised of the resistor 17 and the delay element 40 is connected in parallel to the horizontal-type electro-optical crystal 14. Further, a series of resistors comprised of the delay element 35 and the resistor 38 is connected in parallel to the compensation-purpose crystal 43, but the connection units 36, 39 need to be wired with a wire 500 to the electrode film 16 on the horizontal-type electro-optical crystal 14 as shown in FIG. 12C.

Figure 12D:
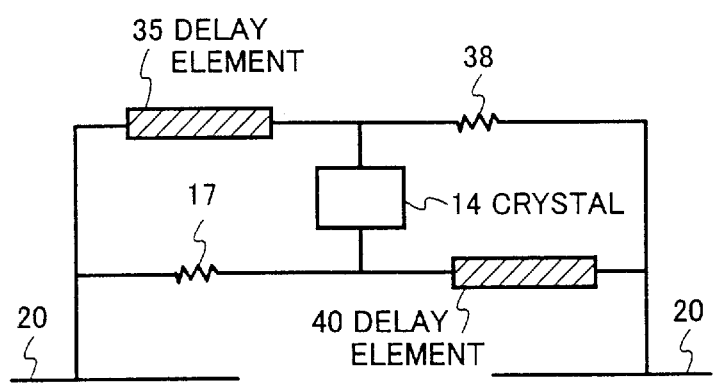
FIG. 12D is a circuit diagram showing an equivalent circuit of the configuration of FIGS. 12A and 12B.

FIG. 12D is a circuit diagram showing an equivalent circuit of the configuration of FIGS. 12A and 12B. In the same fashion as in the third embodiment, the resistance value R1 of the resistor 17 may be set equal to the resistance value R4 of the resistor 38, and the resistance value R3 of the delay element 35 may be set equal to the resistance value R2 of the delay element 40. With such settings, the amounts of currents flowing through the two resistance series can be made identical, thereby insuring the same amount of heat generation. This can resolve temperature dependency without providing a special heater-control unit for heat-control purposes.

The first through sixth embodiments of the present invention have been described heretofore. In measurement of voltage waveforms by use of an electro-optical crystal, the measurement may be affected by a ground voltage of metal components constituting a differential probe and a ground voltage of the ground plate of a target circuit, with a result that an accurate measurement becomes difficult.

Figure 13A:
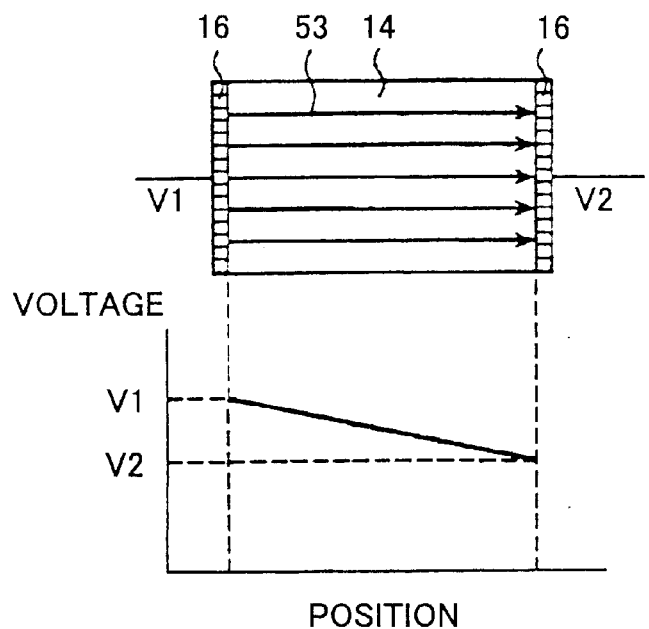
FIG. 13A is an illustrative drawing showing an electric field under an ideal condition where no ground voltage is nearby.

FIG. 13A is an illustrative drawing showing an electric field under an ideal condition where no ground voltage is nearby. As shown in FIG. 13A, inside the horizontal-type electro-optical crystal 14, a homogeneous potential slope is formed in response to the voltage V (=V1–V2) that is applied to the electrode films 16. An electric line force 53 is formed from one of the electrode films 16 to the other of the electrode films 16 as represented by parallel lines.

Figure 13B:
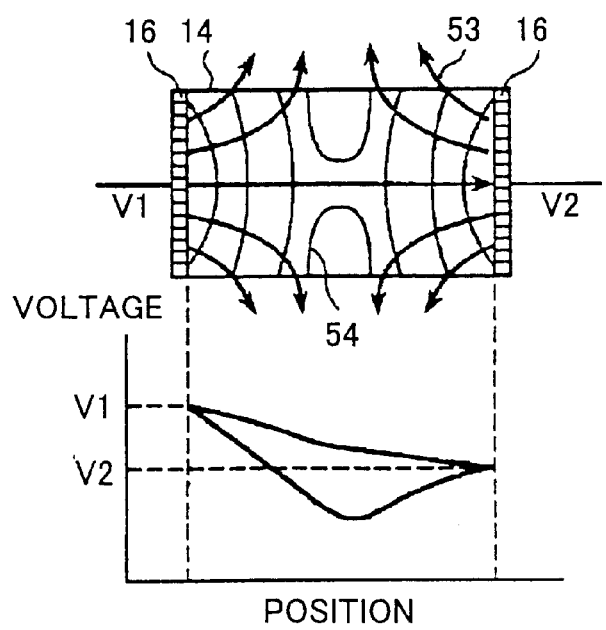
FIG. 13B is an illustrative drawing showing an electric field under the influence of a nearby ground potential.

FIG. 13B is an illustrative drawing showing an electric field under the influence of a nearby ground potential. In FIG. 13B, there is electric field from the electrode films 16 to a nearby ground potential, so that the electric field inside the horizontal-type electro-optical crystal 14 becomes distorted.

Such influence of a nearby ground potential can be eliminated by covering the side surfaces of the horizontal-type electro-optical crystal 14 with conductive films. In the following, embodiments based on such a configuration will be described.

In what follows, a probe according to a seventh embodiment of the present invention will be described.

Figure 14:
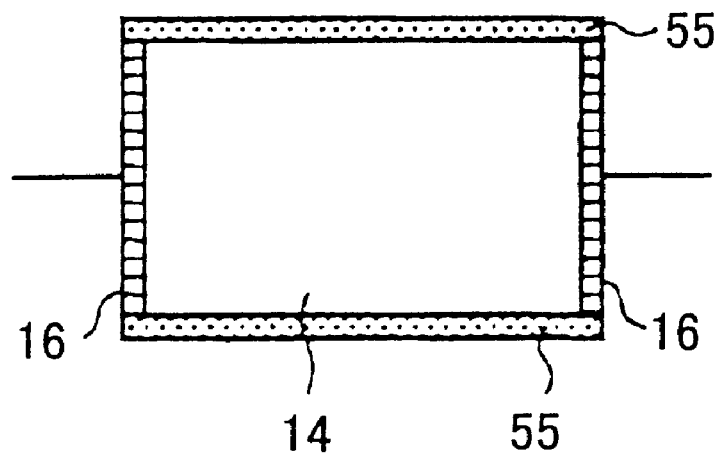
FIG. 14 is an illustrative drawing showing a schematic configuration of a probe according to a seventh embodiment of the present invention.

FIG. 14 is an illustrative drawing showing a schematic configuration of a probe according to the seventh embodiment of the present invention. This view is a plan view of the probe.

As shown in FIG. 14, the horizontal-type electro-optical crystal 14 is provided with the electrode films 16 on a pair of opposing side surfaces thereof. In addition, high-resistance films 55 are provided to cover another pair of side surfaces of the horizontal-type electro-optical crystal 14 so as to electrically connect between the electrode films 16.

The high-resistance films 55 may be formed by attaching amorphous carbon films, for example. An appropriate resistance value of the high-resistance films 55 depends on the resistance value that can be tolerated when inserted into the target circuit. When the thickness of the horizontal-type electro-optical crystal 14 (i.e., the distance between the two high-resistance films 55) is 10 to 20 im, with the distance between the electrode films 16 being 0.5 mm and the length along the optical axis being 2 mm, for example, an appropriate resistance value may be about 10 kΩ.

In the seventh embodiment, the high-resistance films 55 electrically connected to the electrode films 16 shield the horizontal-type electro-optical crystal 14 from external influence, so that a homogeneous potential slope is formed in accordance with the voltage applied to the electrode films 16. This provides a basis for accurate measurement.

In the following, a probe according to an eighth embodiment of the present invention will be described.

Figure 15:
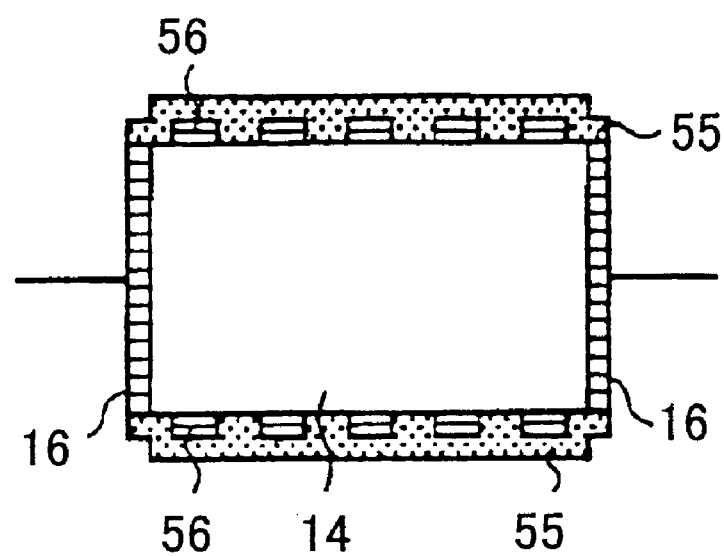
FIG. 15 is an illustrative drawing showing a schematic configuration of a probe according to an eighth embodiment of the present invention.

FIG. 15 is an illustrative drawing showing a schematic configuration of a probe according to the eighth embodiment of the present invention. This view is a plan view of the probe.

As shown in FIG. 15, the horizontal-type electro-optical crystal 14 is provided with the electrode films 16 on a pair of opposing side surfaces thereof. In addition, another pair of side surfaces is provided with dividing electrodes 56, and the high-resistance films 55 are provided to cover the dividing electrodes 56 together with the side surfaces having these electrodes thereon so as to electrically connect between the electrode films 16.

When the thickness of the horizontal-type electro-optical crystal 14 (i.e., the distance between the two high-resistance films 55) is 10 to 20 im, with the distance between the electrode films 16 being 0.5 mm and the length along the optical axis being 2 mm, for example, an appropriate resistance value of the high-resistance films 55 may be about 10 kΩ.

In the eighth embodiment, the high-resistance films 55 electrically connected to the dividing electrodes 56 and to the electrode films 16 shield the horizontal-type electro-optical crystal 14 from external influence, so that a homogeneous potential slope having step-wise changes is formed in accordance with the voltage applied to the electrode films 16. This provides a basis for accurate measurement.

In this embodiment, the high-resistance films 55 do not have to be a single continuous resistance film. For example, the high-resistance films 55 may be separate resistance films provided only between the dividing electrodes 56. Alternatively, the high-resistance films 55 may actually be resistors connecting between the dividing electrodes 56.

In what follows, a probe according to a ninth embodiment of the present invention will be described.

Figure 16:
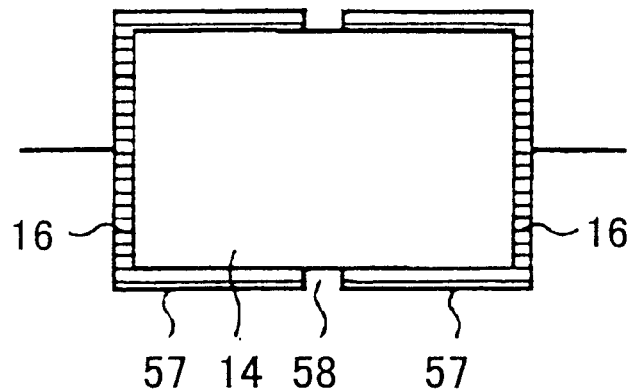
FIG. 16 is an illustrative drawing showing a schematic configuration of a probe according to a ninth embodiment of the present invention.

FIG. 16 is an illustrative drawing showing a schematic configuration of a probe according to the ninth embodiment of the present invention. This view is a plan view of the probe.

As shown in FIG. 16, the horizontal-type electro-optical crystal 14 is provided with the electrode films 16 on a pair of opposing side surfaces thereof, and the electrode films 16 extend to another pair of side surfaces of the horizontal-type electro-optical crystal 14 as extension portions 57. Slits 58 prevent short-circuiting of the electrode films 16.

Figure 17:
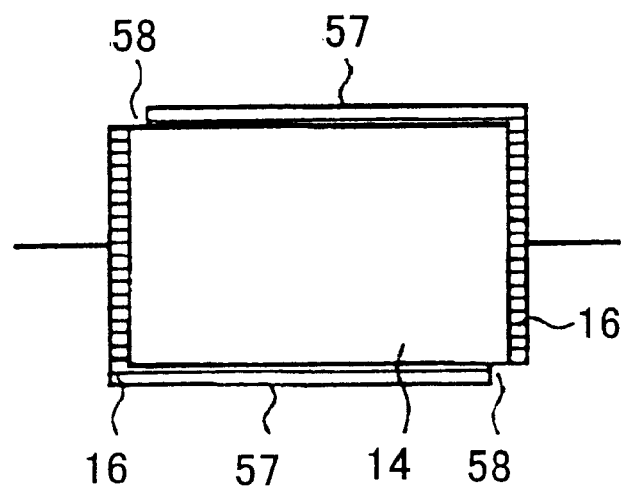
FIG. 17 is an illustrative drawing showing a variation of the ninth embodiment.
Figure 18:
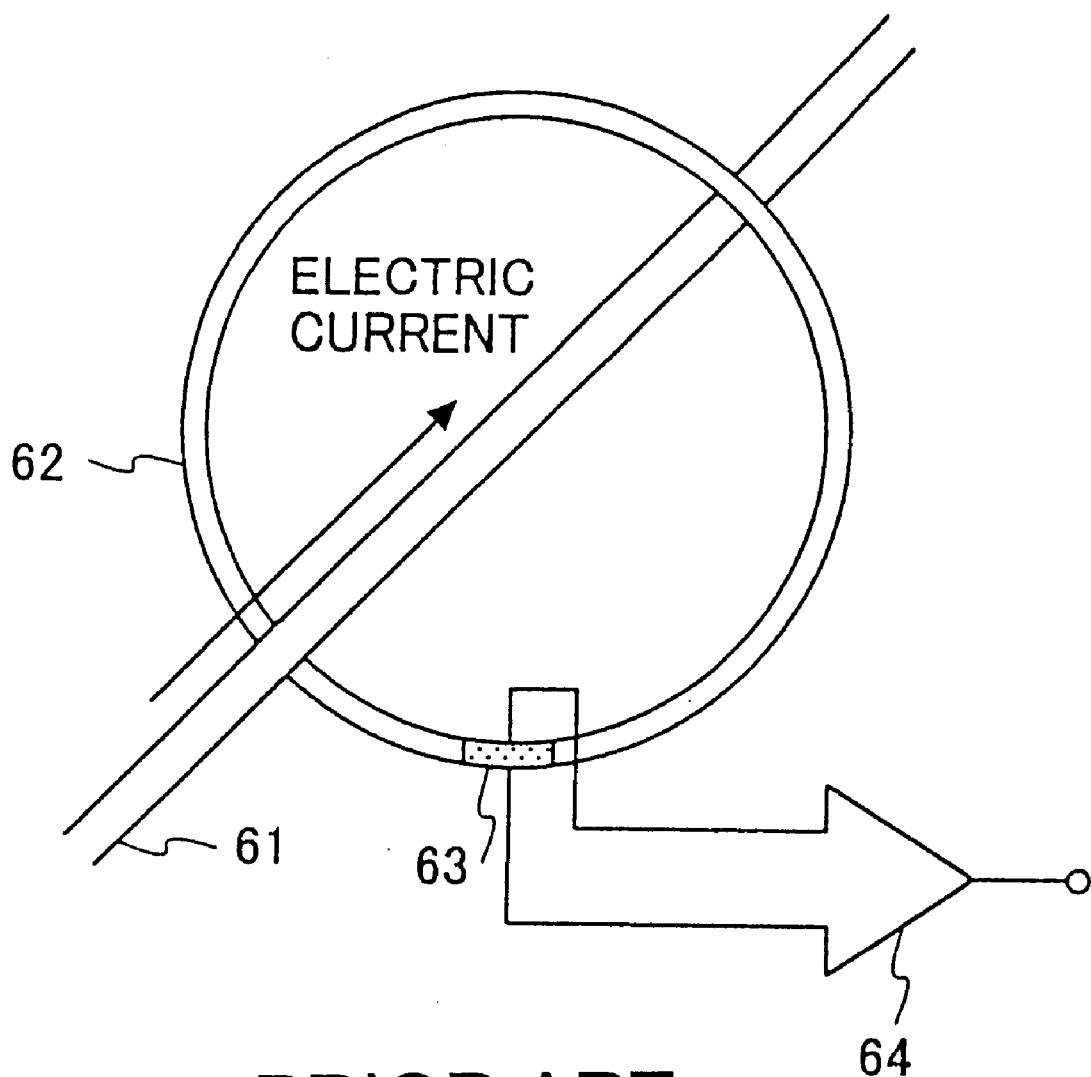
FIG. 18 is a schematic drawing for explaining a related-art method of current detection by use of an electric probe utilizing a Hall device.
Figure 19:
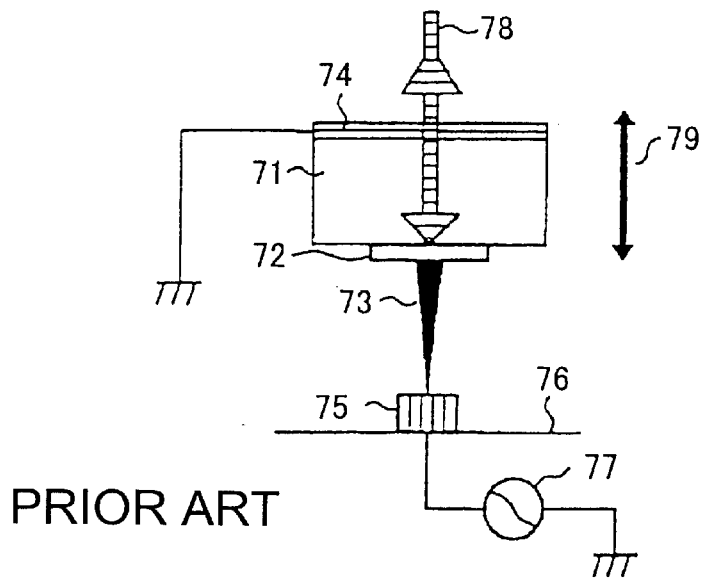
FIG. 19 is a schematic diagram for explaining a related-art method of measuring a voltage level by use of a vertical-type electro-optical crystal.
Figure 20:
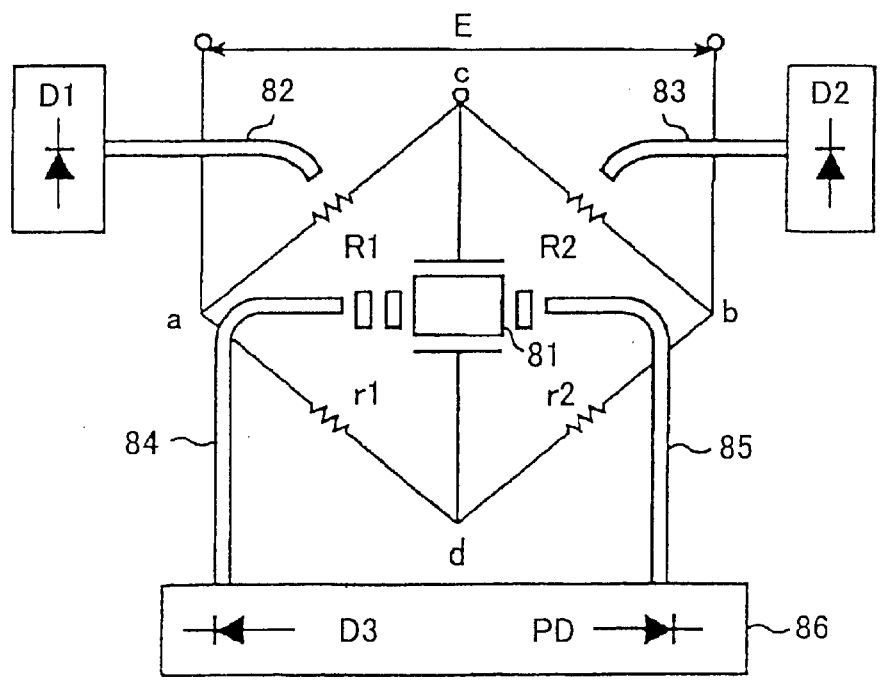
FIG. 20 is a schematic diagram for explaining a related-art method of measuring a voltage level by use of a horizontal-type electro-optical crystal.

FIG. 17 is an illustrative drawing showing a variation of the ninth embodiment. In FIG. 16, the extension portions 57 are formed in a symmetric shape between the right-hand side and the left-hand side. In FIG. 17, on the other hand, the extension portions 57 are formed not to provide a symmetry between the right-hand side and the left-hand side but to provide a rotation symmetry around a center point of the horizontal-type electro-optical crystal 14.

In the ninth embodiment, the extension portions 57 of the electrode films 16 provide shields. Although the electric field inside the horizontal-type electro-optical crystal 14 becomes nonlinear, symmetric arrangement of the extension portions 57 insures that equal-potential contours around the center of the horizontal-type electro-optical crystal 14 becomes rotationally symmetric with respect to the center point where the laser beam passes. This insures accurate measurement. Further, since the slits 58 electrically disconnect the extension portions 57, resistance between the electrode films 16 can be maintained at an almost infinite level.

Further, the present invention is not limited to these embodiments, but variations and modifications may be made without departing from the scope of the present invention.

For example, the horizontal-type electro-optical crystal 14 used in these embodiments may be made of LT (LiTaO$_3$), LN (LiNbO$_c$), or other materials for horizontal-type electro-optical crystal.

Further, vertical-type electro-optical crystal such as ZnTe, Bi$_{12}$SiO$_{20}$, or the like may be used.

Further, the arrangement of the resistor or the delay element is not limited those specifically described in each embodiment, but may be positioned to best accommodate a particular shape of a resistor or a delay element used in a particular configuration. In any case, it suffices if the resistor and the electro-optical crystal are made as a single integrated module inside the probe.

In the probe of the second embodiment, the horizontal-type electro-optical crystal 14 is connected to the contact pin 13. In order to eliminate an electrical connection altogether, however, the contact pin 13 may be separated from the horizontal-type electro-optical crystal 14.

In the probe of the third or sixth embodiment, the contact pins 12 and 13 are connected to the side surfaces of the horizontal-type electro-optical crystal 14 where no electrode film 16 is provided. In order to eliminate an electrical connection altogether, however, the contact pins may be separated from the horizontal-type electro-optical crystal 14.

Moreover, the description of each embodiment has been provided with reference to a case where the target circuit formed on the circuit board 19 has the wire 20 thereof cut for the purpose of inspection. Such a destructive test is typically used for inspecting a circuit that is under development. However, the potion where the wire is cut can be connected via a conductive material to recover the circuit after the test, so that the test by use of the probe of the present invention can be applied to commercial products.

The seventh through ninth embodiments have been described with reference to a case in which the horizontal-type electro-optical crystal is exclusively used. However, the influence of a nearby ground potential or the like is inevitably present in the case of a vertical-type electro-optical crystal. The configurations of the seventh through ninth embodiments can be thus applicable to use of the vertical-type electro-optical crystal.

According to the present invention, an electro-optical crystal is used for the purpose of measuring a high-speed electric-current waveform while such a crystal, especially a horizontal-type electro-optical crystal, has not been employed in an electric-current-waveform detection device in the related art. Further, the electro-optical crystal is made into a module combined with a resistor, thereby allowing accurate measurement by use of a simple configuration.

Further, the probe of the present invention is provided with a delay element for the purpose of compensating for a travel delay, a compensation-purpose crystal for compensating for natural birefringence, and/or a heater for resolving temperature dependency. Such configurations provide a basis for accurate measurement of a high-speed electric-current waveform.

Moreover, the probe of the present invention is provided with conductive films serving as shields for averting the influence of an external ground potential or the like. This provides a basis for accurate measurement.

The present application is based on Japanese priority application No. 11-284492 filed on Oct. 5, 1999, with the Japanese Patent Office, the entire contents of which are hereby incorporated by reference.

What is claimed is:

1. A device for measuring an electric current of a target circuit, comprising:

a pair of contact pins;

a first resistor electrically connected between said contact pins, a voltage drop appearing between said contact pins when said contact pins direct the electric current to said first resistor; and an electro-optical crystal electrically connected between said contact pins in parallel with said first resistor, said electro-optical crystal having a voltage responsive to said voltage drop, wherein said voltage of said electro-optical crystal changes a polarization of a light beam passing through said electro-optical crystal, measuring the electric current between said contact pins on the basis of said change of the polarization.

2. The device as claimed in claim 1, further comprising a first delay element electrically connected between said electro-optical crystal and one of said contact pins, said first delay element compensating for a travel delay of the electric current passing through said first resistor.

3. The device as claimed in claim 2, further comprising:

a second resistor electrically connected in series with said first delay element between said contact pins, a junction between said second resistor and said first delay element being connected to said electro-optical crystal; and a second delay element electrically connected in series with said first resistor between said contact pins, a junction between said second delay element and said first resistor being connected to said electro-optical crystal.

4. The device as claimed in claim 1, further comprising conductive films that substantially shield said electro-optical crystal, said conductive films having said voltage substantially applied thereto.

5. The device as claimed in claim 1, further comprising a compensation-purpose crystal that compensates for birefringence characteristics of said electro-optical crystal.

6. The device as claimed in claim 5, further comprising a heater that applies heat to the compensation-purpose crystal to compensate for temperature dependency of said electro-optical crystal and said compensation-purpose crystal.

7. A device for measuring an electric current between said contact pins, comprising:

a pair of contact pins;

a resistor electrically connected between said contact pins; and an electro-optical crystal electrically connected between said contact pins in parallel with said resistor, said electro-optical crystal having a voltage responsive to a voltage drop appearing between said contact pins when an electric current passes through said resistor.

* * * * *